(12) United States Patent
Nemouchi et al.

(10) Patent No.: US 10,340,361 B2
(45) Date of Patent: Jul. 2, 2019

(54) FORMING OF A MOS TRANSISTOR BASED ON A TWO-DIMENSIONAL SEMICONDUCTOR MATERIAL

(71) Applicant: Commissariat à l'Énergie Atomique et aux Énergies Alternatives, Paris (FR)

(72) Inventors: Fabrice Nemouchi, Moirans (FR); Yves Morand, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/981,953

(22) Filed: May 17, 2018

(65) Prior Publication Data

US 2018/0337252 A1 Nov. 22, 2018

(30) Foreign Application Priority Data

May 18, 2017 (FR) ...................... 17 54386

(51) Int. Cl.
*H01L 21/8234* (2006.01)
*H01L 29/78* (2006.01)
(Continued)

(52) U.S. Cl.
CPC .... *H01L 29/66477* (2013.01); *H01L 21/0228* (2013.01); *H01L 21/3212* (2013.01);
(Continued)

(58) Field of Classification Search
CPC ............. H01L 21/3212; H01L 29/0865; H01L 29/0882; H01L 29/16; H01L 29/1606; H01L 29/24; H01L 29/41783; H01L 29/66045; H01L 29/66431; H01L 29/66545; H01L 29/66969; H01L 29/778; H01L 29/7789; H01L 29/785
See application file for complete search history.

(56) References Cited

U.S. PATENT DOCUMENTS 9,437,614 B1 * 9/2016 Lee .................. H01L 29/20
2009/0020764 A1 1/2009 Anderson et al.
(Continued)

OTHER PUBLICATIONS

French Search Report for Application No. FR 1754386 dated Feb. 1, 2018.
Li et al., MoS$_2$ U-shape MOSFET with 10 nm Channel Length and Poly-Si Source/Drain Serving as Seed for Full Wafer CVD MoS$_2$ Availability. 2016 Symposium on VLSI Technology Digest of Technical Papers. 2016;52-3.

*Primary Examiner* — Stephen W Smoot
(74) *Attorney, Agent, or Firm* — Wolf, Greenfield & Sacks, P.C.

(57) ABSTRACT

A MOS transistor manufacturing method, including: forming a first conductive or semiconductor layer; forming a sacrificial gate on the first layer and a second layer made of an insulating material laterally surrounding the sacrificial gate; forming, on either side of the sacrificial gate, source and drain electric connection elements crossing the second layer and contacting the first layer; removing the sacrificial gate and the portion of the first layer located vertically in line with the sacrificial gate; depositing a third layer made of a two-dimensional semiconductor material; depositing a fourth layer made of an insulating material on the third layer; and forming a conductive gate in the opening, on the fourth layer.

9 Claims, 3 Drawing Sheets

(51) Int. Cl.
*H01L 29/66* (2006.01)
*H01L 29/778* (2006.01)
*H01L 21/02* (2006.01)
*H01L 21/321* (2006.01)
*H01L 29/08* (2006.01)
*H01L 29/417* (2006.01)
*H01L 29/16* (2006.01)
*H01L 29/24* (2006.01)

(52) U.S. Cl.
CPC .... *H01L 29/0847* (2013.01); *H01L 29/41783* (2013.01); *H01L 29/66045* (2013.01); *H01L 29/66431* (2013.01); *H01L 29/66545* (2013.01); *H01L 29/66969* (2013.01); *H01L 29/778* (2013.01); *H01L 29/7789* (2013.01); *H01L 29/78* (2013.01); *H01L 29/785* (2013.01); *H01L 29/1606* (2013.01); *H01L 29/24* (2013.01)

(56) References Cited

U.S. PATENT DOCUMENTS

| | | | |
|---|---|---|---|
| 2011/0291184 A1* | 12/2011 | Yin | H01L 29/66545 257/330 |
| 2013/0271208 A1* | 10/2013 | Then | H01L 25/072 327/541 |
| 2014/0094223 A1* | 4/2014 | Dasgupta | H01L 29/4236 455/566 |
| 2014/0353589 A1 | 12/2014 | Cao et al. | |
| 2015/0091060 A1* | 4/2015 | Yang | H01L 29/66431 257/194 |
| 2015/0255458 A1* | 9/2015 | Ando | H01L 29/517 257/401 |
| 2017/0365661 A1* | 12/2017 | Doris | H01L 29/0673 |

* cited by examiner

FORMING OF A MOS TRANSISTOR BASED ON A TWO-DIMENSIONAL SEMICONDUCTOR MATERIAL

This application claims the priority benefit of French patent application number 17/54386, the content of which is hereby incorporated by reference in its entirety to the maximum extent allowable by law.

BACKGROUND

The present disclosure concerns the forming of a MOS transistor based on a two-dimensional semiconductor material.

DISCUSSION OF THE RELATED ART

A two-dimensional material is a crystalline material formed of a stack of one or a plurality of sheets, each made of a single layer of atoms or molecules. The atoms or molecules of a same sheet are relatively strongly bonded by covalent bonds, while the atoms or molecules of neighboring sheets are relatively lightly bonded by bonds of Van der Waals type.

Two-dimensional semiconductor materials are considered as promising in nanoelectronics, since they enable to obtain very thin crystal layers. This particularly enables to envisage the forming of semiconductor components of nanometer-range dimensions on support substrates of various natures, for example, glass or plastic substrates, by using a deposited two-dimensional material as a semiconductor material.

The article entitled "MoS2 U-shape MOSFET with 10 nm Channel Length and Poly-Si Source/Drain Serving as Seed for Full Wafer CVD MoS2 Availability" of Kai-Shin Li et al. (Symposium on VLSI Technology, 2016 IEEE), describes a method of manufacturing a MOS transistor where the channel region is made of crystalline molybdenum disulfide (MoS2), which is a two-dimensional semiconductor material, deposited on a silicon oxide support.

This method however has disadvantages. In particular, it comprises two different photolithography steps, respectively to delimit the source and drain regions of the transistor and to delimit the transistor gate. In other words, the transistor gate is not self-aligned with the source and drain regions. As a result, the transistor gate extends not only above the channel region of the transistor, but also above a portion of the source region and above a portion of the drain region of the transistor. This results in increasing the general bulk of the transistor.

SUMMARY

Thus, an embodiment provides a MOS transistor manufacturing method comprising the successive steps of:

a) forming a first layer made of a conductive or semiconductor material on a surface of a support substrate;

b) forming a sacrificial gate on the upper surface of the first layer, and a second layer made of an insulating material laterally surrounding the sacrificial gate;

c) forming, on either side of the sacrificial gate, source and drain electric connection elements made of a conductive material, crossing the second layer and contacting the first layer;

d) removing the sacrificial gate and the portion of the first layer located vertically in line with the sacrificial gate;

e) depositing a third layer of a two-dimensional semiconductor material on the sides and on the bottom of an opening formed at step d) by the removal of the sacrificial gate and of the first layer;

f) depositing a fourth layer of an insulating material on the third layer; and g) forming a conductive gate in the opening, on the fourth layer.

According to an embodiment, the two-dimensional semiconductor material of the third layer is a material from the group comprising graphene, silicene, germanene, and transition metal dichalcogenides.

According to an embodiment, the third layer is made of a stack of from 1 to 10 two-dimensional crystalline sheets, each formed of a single layer of atoms or of molecules of the two-dimensional semiconductor material.

According to an embodiment, at step d), the removal of the portion of the first layer opposite the sacrificial gate results in delimiting in the first layer the source region and the drain region of the transistor.

According to an embodiment, step g) comprises a step of depositing one or a plurality of conductive gate materials over the entire upper surface of the structure obtained at the end of step f), followed by a chem.-mech. planarization step to remove the conductive gate material(s) outside of the opening.

According to an embodiment, at steps e) and f), the third and further layers are deposited over the entire upper surface of the structure obtained at the end of step d) and the planarization step implemented at step g) results in removing the third and fourth layers outside of the opening.

According to an embodiment, the method further comprises, at step b), after the forming of the sacrificial gate and before the deposition of the second layer, a step of forming spacers of an insulating material coating the sides of the sacrificial gate.

According to an embodiment, at step d), the sacrificial gate is removed selectively over the spacers.

According to an embodiment, the source and drain electric connection elements formed at step c) are self-aligned with respect to the sacrificial gate.

Another embodiment provides a MOS transistor comprising:

source and drain regions formed in a first conductive or semiconductor layer;

a channel region made of a two-dimensional semiconductor material, separating the source region from the drain region;

a dielectric layer coating the channel region between the source and drain regions; and a conductive gate topping the dielectric layer between the source and drain regions, wherein the conductive gate is self-aligned with respect to the source and drain regions.

The foregoing and other features and advantages will be discussed in detail in the following non-limiting description of specific embodiments in connection with the accompanying drawings.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the various possible applications of the described transistors have not been detailed.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described structures may be oriented differently. The terms "approximately", "substantially", and "in the order of" are used herein to designate a tolerance of plus or minus 10%, preferably of plus or minus 5%, of the value in question.

FIGS. 1A to 1H are cross-section views illustrating successive steps of an example of a method of manufacturing a MOS transistor having its channel region made of a two-dimensional material. Although FIGS. 1A to 1H show the forming of a single transistor, it should be understood that in practice, a large number of transistors, for example, identical or similar, may be simultaneously formed on a same support substrate.

Figure 1A:
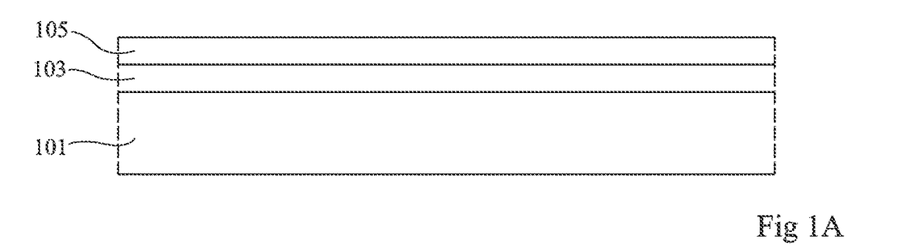
FIGS. 1A and 1H are cross-section views illustrating steps of an example of a method of manufacturing a MOS transistor according to an embodiment.

FIG. 1A illustrates an initial step of deposition of an insulating layer 103 on the upper surface of a support substrate 101. Substrate 101 may be a solid silicon substrate, a substrate of silicon-on-insulator type, a glass substrate, a plastic substrate, or any other adapted rigid or flexible support substrate. Insulating layer 103 is for example a silicon oxide layer (SiO2), a silicon nitride layer (SiN), an alumina layer ($Al_2O_3$), a hafnium oxide layer (HfO2), or an aluminum nitride layer (AlN). The thickness of insulating layer 103 is for example in the range from 2 to 500 nm and preferably from 2 to 10 nm.

FIG. 1A further illustrates a step of deposition on the upper surface of insulating layer 103 of a conductive or semiconductor layer 105 where the source and drain regions of the transistor will be subsequently formed. Layer 105 is for example made of a doped semiconductor material, for example, silicon, germanium, or silicon-germanium. As a variation, layer 105 is made of a conductive material, for example, a metal, for example, tungsten, aluminum, or titanium nitride. As a variation, layer 105 is made of a silicide or of a germanide. The thickness of layer 105 is for example in the range from 10 to 100 nm.

In this example, layers 103 and 105 are deposited over substantially the entire upper surface of support substrate 101.

Figure 1B:
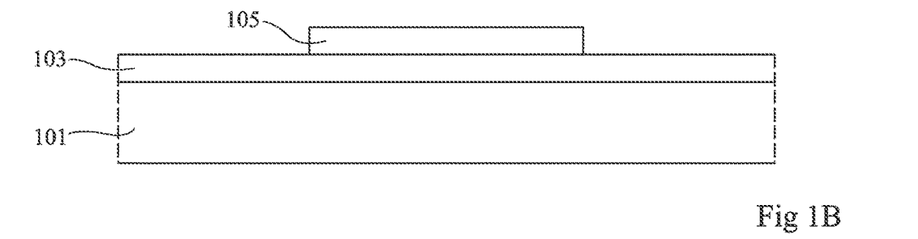

FIG. 1B illustrates a step of local removal of layer 105 to only keep a portion of layer 105 corresponding to the future source and drain regions of the transistor. At this stage, the kept portion of layer 105 further extends opposite the future channel region of the transistor. The local removal of layer 105 may be performed by photolithography and etching, for example, by dry or wet etching. During this step, insulating layer 103 is kept over the entire upper surface of substrate 101.

Figure 1C:
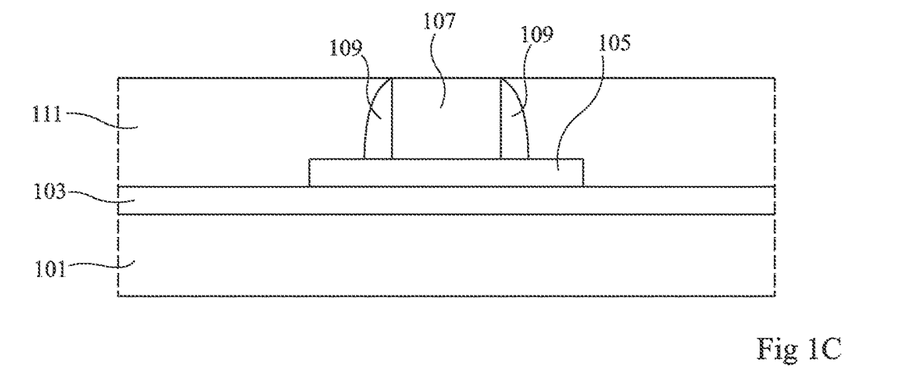

FIG. 1C illustrates a step of forming of a sacrificial gate 107 on the upper surface of the portion of layer 105 kept at the step of FIG. 1B, at the location of the future gate of the transistor. Sacrificial gate 107 is for example made of a material selectively etchable over the material of layer 105. As an example, in the case where layer 105 is made of metal, sacrificial gate 107 may be made of silicon or of germanium. A layer of the material forming the sacrificial gate is for example first deposited over the entire upper surface of substrate 101, and then locally removed by photolithography and etching to only keep sacrificial gate 107. The thickness (or height) of sacrificial gate 107 is for example in the range from 20 to 100 nm. In top view, the sacrificial gate for example thoroughly crosses the portion of layer 105 which has been kept at the step of FIG. 1B, to delimit in said portion the source and drain regions of the transistor. As an example, sacrificial gate 107 has, in top view, the shape of a rectilinear bar thoroughly crossing the portion of layer 105 kept at the step of FIG. 1B.

FIG. 1C further illustrates the forming of spacers 109 made of a dielectric material, for example, of SiN or of SiCBN, coating the sides of sacrificial gate 107. As an example, a layer of the dielectric material forming spacers 109 is first deposited by conformal deposition over the entire upper surface of the structure after the forming of sacrificial gate 107, after which a step of anisotropic etching of this layer is implemented to keep the dielectric material only on the sides of sacrificial gate 107. As an example, spacers 109 have a thickness in the range from 5 to 20 nm, and extend along substantially the entire height of sacrificial gate 107. The material of spacers 109 is preferably selected so that sacrificial gate 107 is selectively etchable over the spacers.

FIG. 1C further illustrates a step of forming of an insulating encapsulation layer 111, for example, made of silicon oxide, laterally surrounding sacrificial gate 107 and spacers 109 and extending along substantially the entire height of sacrificial gate 107 to only leave access to the upper surface of sacrificial gate 107 and, possibly, of spacers 109. As an example, a layer of the encapsulation material is first deposited over the entire upper surface of the structure (after the forming of sacrificial gate 107 and of spacers 109) across a thickness greater than that of sacrificial gate 107, for example, across a thickness in the range from 50 to 500 nm. A step of planarizing the upper surface of the structure, for example, by chem.-mech. polishing, is then implemented to remove the excess encapsulation material. The planarization step is stopped when the upper surface of sacrificial gate 107 is exposed as shown in FIG. 1C.

Figure 1D:
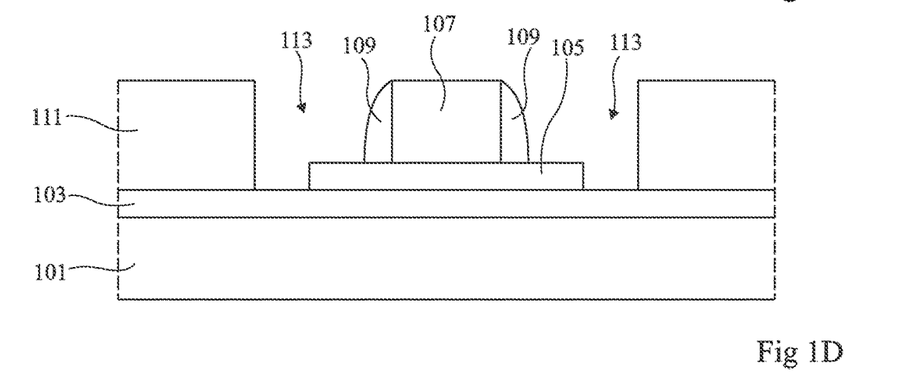

FIG. 1D illustrates a step of forming of openings 113 in encapsulation layer 111, on either side of sacrificial gate 107, opposite the source and drain regions of the transistor, for a subsequent step where an electric contact is taken on the source and drain regions. Openings 113 are for example formed by lithography and etching, and emerge onto the upper surface of the portion of layer 105 kept at the step of FIG. 1B.

As an example, the region exposed to etching on forming of openings 113 encompasses sacrificial gate 107 and spacers 109, as well as all or part of the portion of layer 105 which is not topped with sacrificial gate 107 and with spacers 109. In this case, the etch method used is selected to be selective over sacrificial gate 107 and spacers 109, to enable to remove the encapsulation material without removing sacrificial gate 107 and spacers 109. An advantage is that the source and drain contacts of the transistor will then be self-aligned with respect to sacrificial gate 107 and to spacers 109.

In the shown example, the region exposed to etching on forming of openings 113 encompasses the entire portion of layer 105 kept at the step of FIG. 1B and further laterally extends beyond layer 105, on either side of sacrificial gate 107. In other words, in this example, the source and drain contact regions of the transistor are longer than the source and drain regions to be contacted.

Figure 1E:
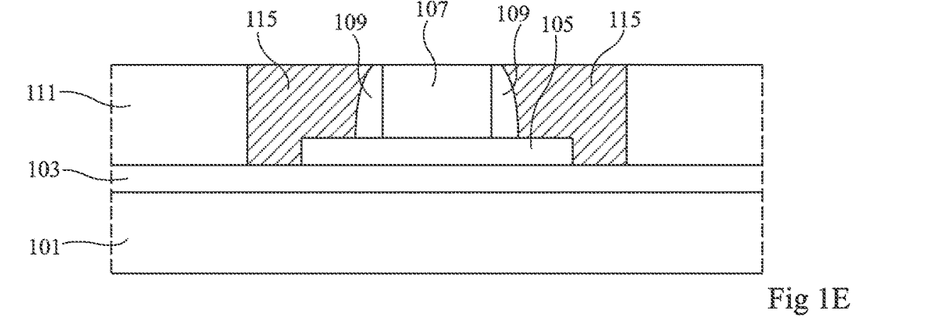

FIG. 1E illustrates a step of filling of openings 113 formed at the step of FIG. 1D with a conductive material, for example, a metal, for example, tungsten, cobalt, copper, titanium, titanium nitride, tantalum, tantalum nitride, or a combination thereof (for example, Ti/TiN/W or Ta/TaN/Cu), to form the source and drain contacts 115 of the transistor. As an example, the source and drain contacts 115 are formed by chemical vapor deposition (CVD). As a variation, the forming of source and drain contacts 115 comprises a first step of spraying (PVD) of a conductive bonding layer on the lateral walls and on the bottom of openings 113, followed by a step of filling of openings 113 with a conductive material, for example, by CVD. According to the materials used, a conductive barrier layer, for example, a titanium nitride layer, may possibly be deposited on the lateral walls and on the bottom of openings 113 before the filling of the openings, to avoid the diffusion of the conductive material of contacts 115 into encapsulation layer 111 and/or into spacers 109 and/or into layer 105.

As an example, the conductive material(s) for forming the source and drain contacts are first deposited over the entire upper surface of the structure, across a thickness greater than or equal to the depth of openings 113. A step of planarizing the upper surface of the structure, for example, by chem.-mech. polishing, is then implemented to remove the conductive material(s) outside of openings 113. The planarization step is interrupted when the upper surface of sacrificial gate 107 is exposed. A slight overpolishing may be provided as shown in FIG. 1E, to avoid any risk of short-circuit between source and drain contacts 115 and the future conductive gate of the transistor.

Figure 1F:
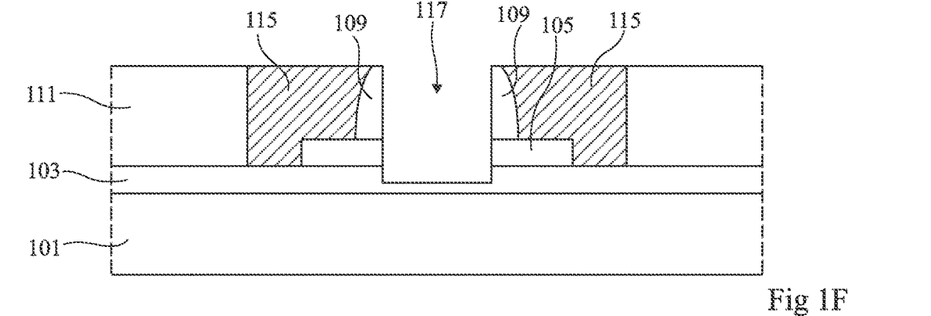

FIG. 1F illustrates a first step of removal of sacrificial gate 107. As an example, sacrificial gate 107 is removed by chemical etching. The etch method used to remove sacrificial gate 107 is preferably selective over the material forming spacers 109, to remove the sacrificial gate without damaging the spacers. The etching is for example interrupted at the level of the upper surface of layer 105.

FIG. 1F further illustrates a second step subsequent to the removal of sacrificial gate 107, during which the portion of layer 105 located vertically in line with sacrificial gate 107 is removed, to insulate the source region from the drain region of the transistor. To achieve this, a second etching may be implemented, and this second etching may be stopped on the upper surface or in insulating layer 103, or also on the upper surface or in substrate 101 (in the case where substrate 101 is made of an insulating material). In a preferred embodiment, the etching is interrupted substantially at the level of the upper surface of insulating layer 103, to align the source and drain regions formed in layer 105 on the planar portion of the future channel region of the transistor.

As a variation, the removal of sacrificial gate 107 and the removal of the portion of layer 105 located under sacrificial gate 107 may be performed during a same etch step.

The opening formed in the structure by the removal of sacrificial gate 107 and of the portion of layer 105 located under sacrificial gate 107 is designated with reference numeral 117.

Figure 1G:
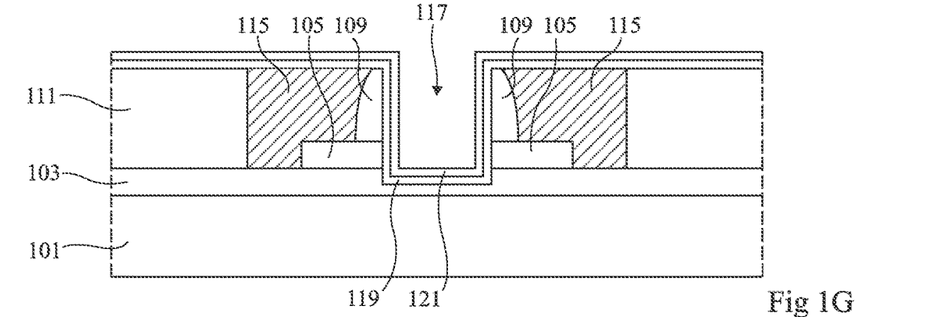

FIG. 1G illustrates a step of deposition on the lateral walls and on the bottom of opening 117 of a layer 119 of a two-dimensional semiconductor material intended to form the channel region of the transistor. In particular, layer 119 deposited at the step of FIG. 1G comes into contact with the sides of the source and drain regions of the transistor, defined at the previous step in layer 105. In a preferred embodiment, the two-dimensional material used to form the channel region is a material from the group of transition metal dichalcogenides, for example, WS2, MoS2, WSe2, or MoSe2. As a variation, the two-dimensional material used may be graphene, silicone, germanene, or any other adapted two-dimensional material. As an example, the layer of two-dimensional material 119 is deposited over the entire upper surface of the structure obtained at the end of the steps of FIG. 1F, for example, by CVD. The layer of two-dimensional material 119 for example has a thickness in the range from 1 to 5 nm. As an example, layer 119 is formed of a stack of from 1 to 10 two-dimensional crystalline sheets, each formed of a single layer of atoms or of molecules.

FIG. 1G further illustrates a step of deposition, on the upper surface of the layer of two-dimensional material 109, of a layer 121 made of a dielectric material intended to form the gate insulator of the transistor. As an example, dielectric layer 121 is made of Al2O3, of HfO2, or of ZrO2. Layer 121 for example has a thickness in the range from 1 to 5 nm. Layer 121 is for example deposited over the entire upper surface of the structure, for example, by deposition in successive monolayers (ALD) or by CVD.

Figure 1H:
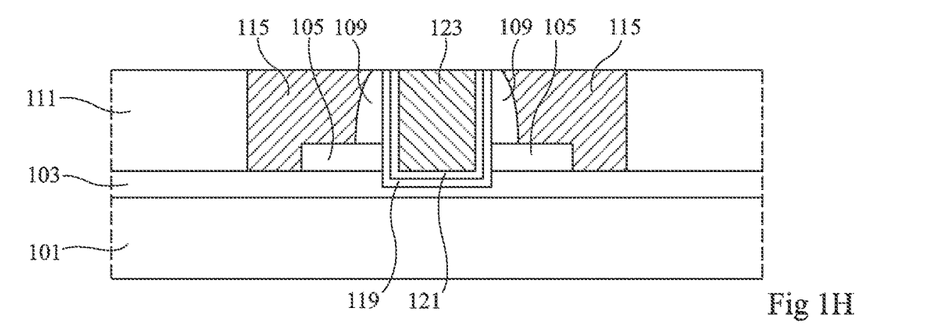

FIG. 1H illustrates a step of filling of opening 117 with a conductive material, after the deposition of layers 119 and 121, to form conductive gate 123 of the transistor. Gate 123 may be formed of a stack of one or a plurality of metal layers, for example, from the group comprising tungsten, cobalt, copper, aluminum, and titanium nitride. The gate stack is for example deposited by CVD, or by PVD, and then by CVD. As an example, the gate stack is first deposited over the entire surface of the structure obtained at the end of the steps of FIG. 1G, across a thickness greater than the depth of opening 117. A step of planarization of the upper surface of the structure, for example, by chem.-mech. polishing, is then implemented to remove the gate metal(s), as well as layer 119 and 121, outside of opening 117. According to the two-dimensional material used to form channel region 119 of the transistor, a layer capable of adjusting the charge transport properties of layer 119 may be deposited before the forming of gate stack 123. Further, according to the materials used, a barrier layer may be provided between gate 123 and dielectric layer 121, to avoid the diffusion of the material(s) of the gate stack into dielectric layer 121 and/or into layer 119.

FIG. 1H shows the transistor obtained at the end of the manufacturing process. An advantage of this method is that the transistor formed comprises a gate self-aligned with the source and drain regions of the transistor. In other words, gate 123 of the transistor does not laterally protrude beyond the source and drain regions of the transistor, which limits the general bulk of the transistor. This results from the fact that, in the method of FIGS. 1A to 1H, the source and drain regions and the gate region of the transistor are delimited during a same photolithography step, which corresponds to the step of delimiting sacrificial gate 107 described in relation with FIG. 1C.

Another advantage is that the source and drain contact regions 115 are substantially in the same plane (horizontally) as the gate contact region of the transistor, which simplifies the forming of the transistor interconnections to other circuit elements.

Further, another advantage of the described method is that the two-dimensional semiconductor material used to form the channel region of the transistor is only deposited in the very last steps of the process, and particularly after the forming of the source and drain contacts of the transistor. This enables to decrease risks of damaging the semiconductor material, which is generally very sensitive to the various manipulations due to its two-dimensional structure.

As an example, the gate length (source-drain distance) of the transistor formed is in the range from 5 to 30 nm, for example, in the order of 10 nm. Source and drain contact regions 115 of the transistor for example each have a length (in the transistor gate length direction) in the range from 5 to 30 nm, for example, in the order of 10 nm.

It should be noted that in the example described hereabove in relation with FIGS. 1A to 1H, the source and drain regions of the transistor, formed in layer 105, each have a length smaller than the length of the corresponding source or drain contact region 115. The described embodiments are however not limited to this specific case. As a variation, each of the source and drain regions of the transistor may have a length substantially equal, or even greater, than the length of the corresponding contact region 115.

Figure 2:
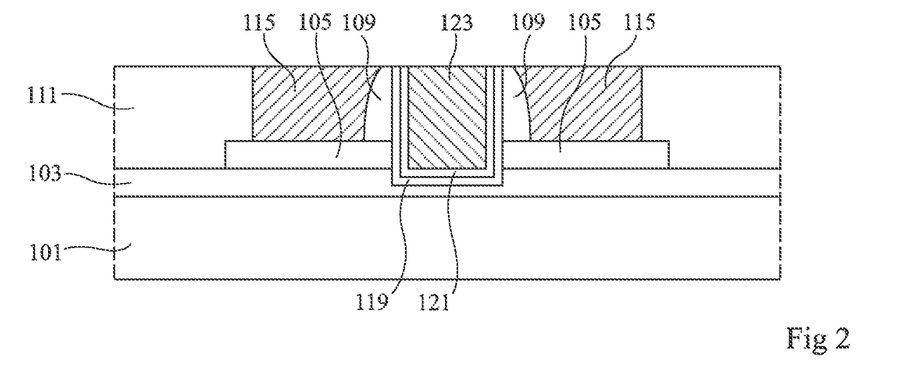
FIG. 2 is a cross-section view illustrating a variation of the method of FIGS. 1A to 1H.

FIG. 2 illustrates an alternative embodiment of the transistor of FIG. 1H, where each of the source and drain regions of the transistor has a length greater than the length of the corresponding source or drain contact region 115.

Figure 3A:
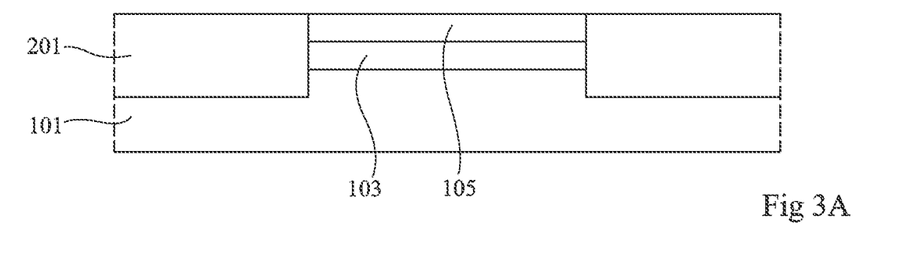
FIGS. 3A and 3B are cross-section views illustrating another variation of the method of FIGS. 1A to 1H.
Figure 3B:
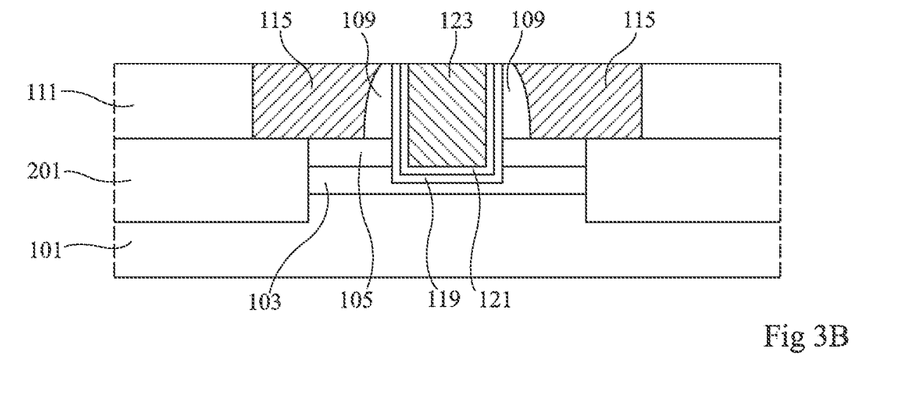

FIGS. 3A and 3B illustrate another variation of the method of FIGS. 1A to 1H. This variation comprises steps common with the method of FIGS. 1A to 1H. Only the differences between the two methods will be detailed hereafter.

The method of FIGS. 3A and 3B comprises the same initial steps as those described in relation with FIG. 1A.

FIG. 3A illustrates a step where, starting from the structure of FIG. 1A, a local etching of layer 105 is performed, as in the example of FIG. 1B, to only keep a portion of layer 105 corresponding to the future source and drain regions of the transistor. The local etching step of FIG. 3A differs from the local etching step of FIG. 1B in that, at the step of FIG. 3A, instead of only etching layer 105, layer 103 and a portion of the thickness of substrate 101 are also etched vertically in line with the etched regions of layer 105.

FIG. 3A further illustrates a step of depositing an insulating filling material 201, for example, silicon oxide, in the trenches formed by the local etching of layers 105 and 103 and of substrate 101. As an example, a layer of the insulating material is deposited over the entire upper surface of the structure obtained after the etch step, across a thickness greater than that of the trenches etched in the stack comprising layers 105 and 103 and substrate 101. A step of planarization of the upper surface of the structure, for example, by chem.-mech. polishing, is then implemented to remove the excess insulating material. The planarization is for example interrupted at the level of the upper surface of the portion of layer 105 kept during the etch step.

The next steps of the method are identical or similar to what has been described previously in relation with FIG. 1C to 1H, or possibly in relation with FIG. 2.

FIG. 3B shows the transistor obtained at the end of the manufacturing process.

Specific embodiments have been described. Various alterations, modifications, and improvements will occur to those skilled in the art. In particular, the described embodiments are limited neither to the examples of dimensions, nor to the examples of materials mentioned in the present description.

It should further be noted that in the case where substrate 101 is made of an insulating material, insulating layer 103 may be omitted.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A MOS transistor manufacturing method, comprising the successive steps of:
   a) forming a first layer made of a conductive or semiconductor material on a surface of a support substrate;
   b) forming a sacrificial gate on the upper surface of the first layer, and a second layer made of an insulating material laterally surrounding the sacrificial gate;
   c) forming, on either side of the sacrificial gate, source and drain electric connection elements made of a conductive material, crossing the second layer and contacting the first layer;
   d) removing the sacrificial gate and the portion of the first layer located vertically in line with the sacrificial gate;
   e) depositing a third layer made of a two-dimensional semiconductor material on the sides and on the bottom of an opening formed at step d) by the removal of the sacrificial gate and of the first layer);
   f) depositing a fourth layer made of an insulating material on the third layer; and
   g) forming a conductive gate in the opening, on the fourth layer.

2. The method of claim 1, wherein the two-dimensional semiconductor material of the third layer is a material from the group comprising graphene, silicene, germanene, and transition metal dichalcogenides.

3. The method of claim 1, wherein the third layer is formed of a stack of from 1 to 10 two-dimensional crystalline sheets, each formed of a single layer of atoms or of molecules of the two-dimensional semiconductor material.

4. The method of claim 1, wherein, at step d), the removal of the portion of the first layer opposite the sacrificial gate results in delimiting in the first layer the source region and the drain region of the transistor.

5. The method of claim 1, wherein step g) comprises a step of depositing one or a plurality of conductive gate materials over the entire upper surface of the structure obtained at the end of step f), followed by a step of chem.-mech. planarization to remove the conductive gate material(s) outside of the opening).

6. The method of claim 5, wherein, at steps e) and f), the third and fourth layers are deposited over the entire upper surface of the structure obtained at the end of step d), and wherein the planarization step implemented at step g) results in removing the third and fourth layers outside of the opening.

7. The method of claim 1, further comprising, at step b), after the forming of the sacrificial gate and before the deposition of the second layer, a step of forming of spacers made of an insulating material coating the sides of the sacrificial gate.

8. The method of claim 7, wherein, at step d), the sacrificial gate is removed selectively over the spacers.

9. The method of claim 1, wherein the source and drain electric connection elements formed at step c) are self-aligned with respect to the sacrificial gate.

* * * * *

UNITED STATES PATENT AND TRADEMARK OFFICE
CERTIFICATE OF CORRECTION

PATENT NO. : 10,340,361 B2
APPLICATION NO. : 15/981953
DATED : July 2, 2019
INVENTOR(S) : Fabrice Nemouchi et al.

Page 1 of 1

It is certified that error appears in the above-identified patent and that said Letters Patent is hereby corrected as shown below:

On the Title Page

Item [71], "Commissariat à l'Énegie Atomique et aux Énergies Alternatives, Paris (FR)" should read --Commissariat à l'Énergie Atomique et aux Énergies Alternatives, Paris (FR)--.

Signed and Sealed this
Twelfth Day of November, 2019

Andrei Iancu
*Director of the United States Patent and Trademark Office*